United States Patent [19]
Lee

[11] Patent Number: 5,903,172
[45] Date of Patent: May 11, 1999

[54] OUTPUT VOLTAGE DETECTION CIRCUIT FOR TRAFFIC SIGNAL CONTROLLER

[75] Inventor: Jeong-Jun Lee, Kyungki-Do, Rep. of Korea

[73] Assignee: LG Industrial Systems Co., Ltd., Seoul, Rep. of Korea

[21] Appl. No.: 08/928,043

[22] Filed: Sep. 11, 1997

[30] Foreign Application Priority Data

Sep. 11, 1996 [KR] Rep. of Korea ................. 96-39245

[51] Int. Cl.[6] ................................................ H03K 5/153
[52] U.S. Cl. ....................... 327/79; 327/161; 327/218; 327/261
[58] Field of Search ........................... 327/79, 141, 161, 327/199, 218, 261, 276

[56] References Cited

U.S. PATENT DOCUMENTS 5,717,335  2/1998  Lee ............................................ 324/414

Primary Examiner—Timothy P. Callahan
Assistant Examiner—Jeffrey Zweizig

[57] ABSTRACT

An improved output voltage detection circuit for a traffic signal controller which is capable of minimizing an operational characteristic variation with respect to the operational temperature variation and enabling a compact product. The circuit includes a detection voltage dividing unit for dividing a detection input voltage having an alternating current component applied to a traffic signal system into voltages having a predetermined level, a latch unit for latching a voltage from the detection voltage dividing unit and generating a detection output voltage, a zero crossing detection signal generation unit for detecting a zero crossing timing from an alternating current voltage power and generating a zero crossing detection signal, a memory unit for storing a delay algorithm therein, and a central processing unit (CPU) for reading a delay algorithm the zero crossing detection signal from the memory unit, performing a delay programming, and applying a latch clock signal to the latch unit as much as a programmed delay constant.

5 Claims, 2 Drawing Sheets

FIG. 1
CONVENTIONAL ART
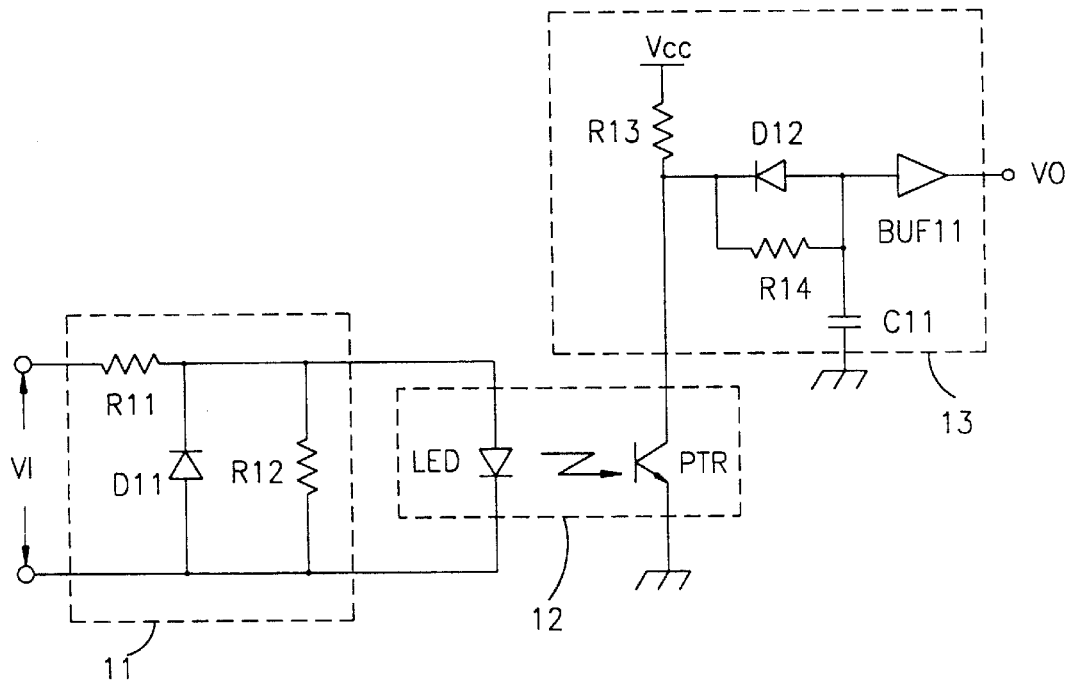
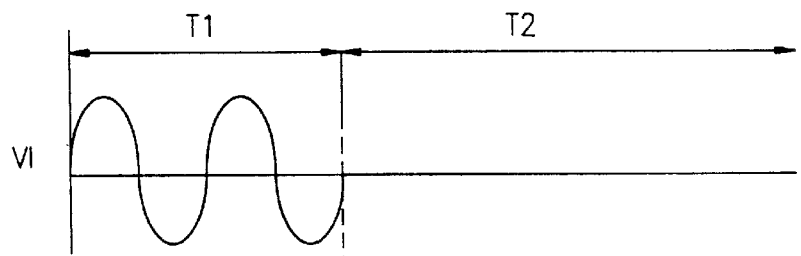
FIG. 2A
CONVENTIONAL ART  VI
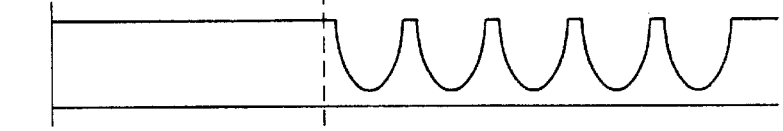
FIG. 2B
CONVENTIONAL ART
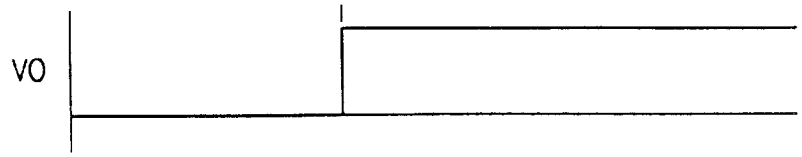
FIG. 2C
CONVENTIONAL ART  VO

FIG. 4A  AC SOURCE VOLTAGE

FIG. 4B  ZC

FIG. 4C  LCK

OUTPUT VOLTAGE DETECTION CIRCUIT FOR TRAFFIC SIGNAL CONTROLLER

BACKGROUND OF THE INVENTION

1. Field of the Invention

The present invention relates to an output voltage detection circuit for a traffic signal controller, and in particular to an improved output voltage detection circuit for a traffic signal controller which is capable of reducing a characteristic variation based on an operational temperature variation, implementing a hybrid integration device, enabling a compact product, and adjusting a detection reference point by a software-based method.

2. Description of the Conventional Art

In the traffic signal controller, there is provided a function that the state of a traffic light ON/OFF signal (lamp on/off signal) is detected in real time for evaluating whether a signal control is normally performed.

The method for detecting whether a signal control is normally performed is classified into two methods. Between the methods, a method is directed to detecting whether a voltage is normally supplied to a traffic light ON/OFF cable which outputs an ON signal, and the other method is directed to detecting whether a voltage is not supplied to a traffic light ON/OFF cable which outputs an OFF signal.

Generally, since checking whether an ON state is correctly generated is important, among the above-described detection methods, the previous method is used for the group of red lights (PR: a pedestrian red light, R: a vehicle red light, Y: a vehicle yellow light). In addition, since whether an OFF state is correctly generated is important, among the above-described detection methods, the later method is used for the group of green light (PG: a pedestrian green light, G: a vehicle green light, A: a vehicle left-turn or right-turn light.

In the traffic signal controller, to detect whether a voltage is normally inputted into the traffic signal controller is important. In the normal state, a traffic signal control is continuously performed. In the abnormal state, a traffic signal control is stopped because a traffic accident may occur, and an on-and-off operation is performed.

As shown in FIG. 1, the conventional output voltage detection circuit for a traffic signal controller includes a detection voltage dividing unit 11 for dividing a detection input voltage VI having an alternating current component, which is applied to a traffic signal system, into voltages having a predetermined level, a photo-coupler 12 for receiving an output voltage from the detection voltage dividing unit 11, and a signal converter 13 for outputting a low level voltage when a voltage is periodically inputted through the photo-coupler 12 and outputting a high level voltage when a voltage is periodically not inputted.

Here, the detection voltage dividing unit 11 includes a resistor R11 which is connected in series with the input terminal, and a diode D11 and a resistor R12 which are connected in parallel with the resistor R11 and the input terminal.

The photo-coupler 12 includes a light emitting diode LED connected in parallel with the detection voltage dividing unit 11 and the resistor R12, and a photo-transistor PTR which is turned on and off in accordance with a detection of the light emitting diode LED.

In addition, the signal converter 13 includes a resistor R13 connected between a power terminal voltage VCC and a photo-transistor PTR of the photo-coupler 12, a resistor R14 and a condenser C11 connected in series between the collector of he photo-transistor PTR of the photo-coupler 12 and a ground, a diode D12 connected in parallel with the resistor R14, and an output buffer BUF11 commonly connected with the resistor R14 and the condenser C11 for outputting an output detection voltage VO.

The operation of the conventional output voltage detection circuit for a traffic signal controller will now be explained with reference to the accompanying drawings.

First, when a power is supplied to a traffic signal ON/OFF cable for turning on/off the traffic signals, the detection input voltage VI having an alternating current component which is fed-back from the traffic signal ON/OFF cable is divided into voltages having a predetermined level by the resistors R11 and R12 and the thusly divided voltages are supplied to the photo-coupler 12.

Here, when the detection input voltage VI is normally inputted, the level thereof is ranged from 120 volts to 220 volts. The light emitting diode LED and the photo-transistor PTR of the photo-coupler 12 are repeatedly turned on/off at a period corresponding to the power frequency.

Namely, when the detection input voltage VI is inputted, the photo-transistor PTR of the photo-coupler 12 is turned on, and the power terminal voltage VCC is applied to the ground terminal through the photo-transistor PTR. A waveform as shown in FIG. 2B is outputted in the interval T1 from the collector of the photo-transistor PTR. When the detection input voltage VI is not applied, since the photo-transistor PTR of the photo-coupler 12 is turned off, and the power terminal voltage VCC is charged by a time constant (T=R14×C11) into the condenser C11 through the resistor R14, the collector of the photo-transistor PTR outputs a high level voltage in the interval T2 as shown in FIG. 2B.

At this time, at the moment when the photo-transistor PTR is turned on, since the voltage is quickly discharged from the diode D12 and the photo-transistor PTR of the signal converter 13 to a ground, while the power is supplied to the traffic signal on/off cable, namely, while the detection input voltage VI is inputted, the output buffer BUF11 outputs a low level detection output voltage VO in the interval T1 as shown in FIG. 2.

On the contrary, when a detection input voltage VI is not inputted, a high level detection output voltage VO as shown in FIG. 2C is outputted in the interval T2.

The detection output voltage VO outputted from the output buffer BUF11 of the signal converter 13 is applied to the system controller (not shown). The system controller (not shown) judges whether a voltage input/output is normally performed with respect to the traffic signal.

Generally, the operational temperature of the traffic signal system is set at −34° C.~+74° C. The voltage feeding-back system is configured such that an input voltage is not detected below AC 15 volts, and the input voltage is detected above AC 25 volts.

In addition, the traffic signal controller is configured such that 48 traffic lights are driven. Therefore, the traffic signal controller outputs 48 has an output circuit of 48 signals. Therefore, in the output voltage feeding-back circuit, the routines are performed 48 time.

However, in the conventional output voltage detection circuit for a traffic signal controller, the photo-coupler 12 is installed as an important element in the circuit. Since the turning-on current of the photo-coupler 12 is varied, the start point of the detection voltage is disadvantageously varied. In addition, it is difficult to configure the apparatus which is capable of satisfying the voltage detection characteristic within a range of the operational temperature of the apparatus.

Furthermore, since it is difficult to manufacture a hybrid IC consisting of the photo-transistor PTR and the light emitting device (LED), it is impossible to manufacture a compact product.

SUMMARY OF THE INVENTION

Accordingly, it is an object of the present invention to provide an output voltage detection circuit for a traffic signal controller which overcomes the aforementioned problem encountered in the conventional art.

It is another object of the present invention to provide an improved output voltage detection circuit for a traffic signal controller which is capable of minimizing an operational characteristic variation with respect to the operational temperature variation and enabling a compact product.

To achieve the above objects, there is provided an output voltage detection circuit for a traffic signal controller which includes a detection voltage dividing unit for dividing a detection input voltage having an alternating current component applied to a traffic signal system into voltages having a predetermined level, a latch unit for latching a voltage from the detection voltage dividing unit and generating a detection output voltage, a zero crossing detection signal generation unit for detecting a zero crossing timing from an alternating current voltage power and generating a zero crossing detection signal, a memory unit for storing a delay algorithm therein, and a central processing unit (CPU) for reading a delay algorithm the zero crossing detection signal from the memory unit, performing a delay programming, and applying a latch clock signal to the latch unit as much as a programmed delay constant.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a circuit diagram illustrating a conventional output voltage detection circuit for a traffic signal controller;

FIGS. 2A through 2C are waveform diagrams of signals in the circuit of FIG. 1;

FIGS. 4A through 4E are waveform diagrams of signals in the circuit of FIG. 3.

DETAILED DESCRIPTION OF THE INVENTION

Figure 3:
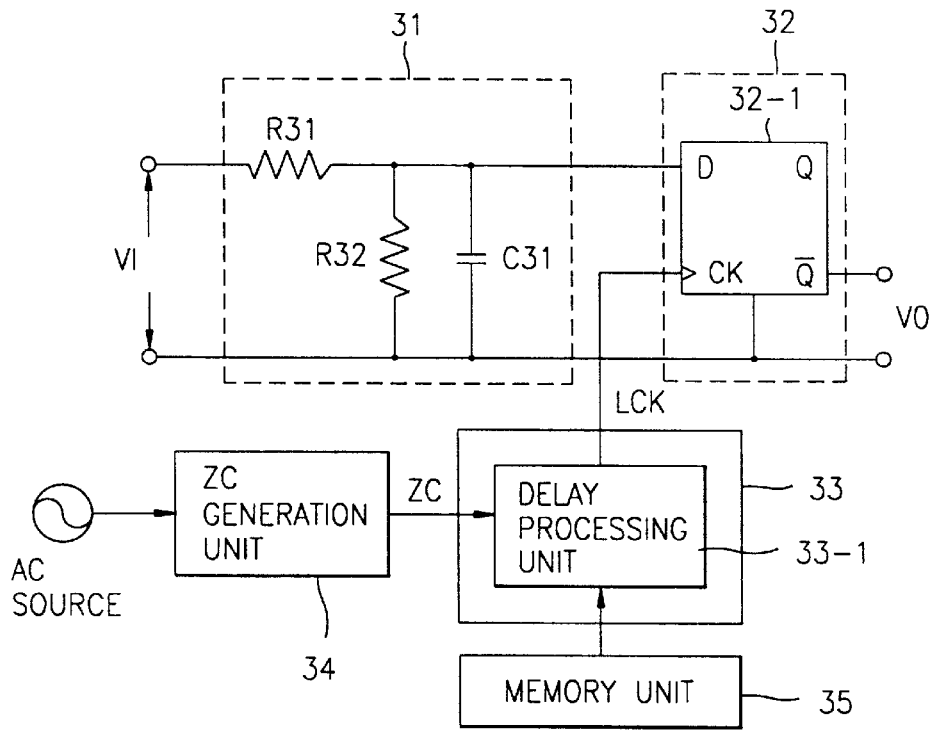
FIG. 3 is a circuit diagram illustrating an output voltage detection circuit for a traffic signal controller according to the present invention.
Figure 3:
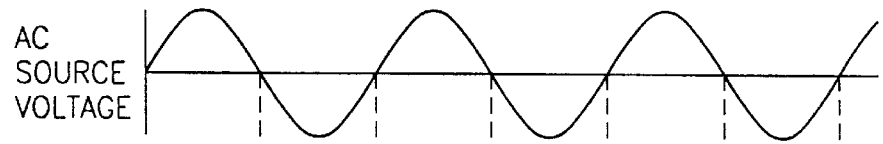
Figure 3:
Figure 3:
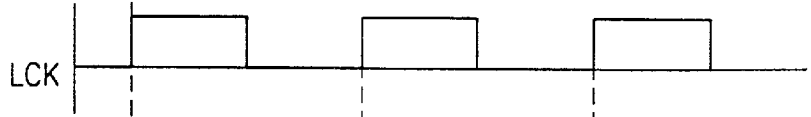
Figure 3:
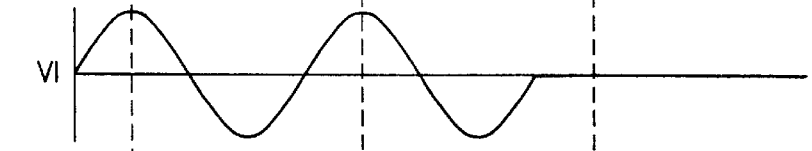
Figure 3:

As shown in FIG. 3, the output voltage detection circuit for a traffic signal controller according to the present invention includes a detection voltage dividing unit 31 for dividing a detection input voltage VI having an alternating current component which is applied to a traffic signal system into voltage having a predetermined level, a latch unit 32 for latching a voltage from the detection voltage dividing unit 31 and outputting the same as a detection output voltage VO, a zero crossing detection signal generation unit 34 for detecting a zero crossing timing from the alternating current voltage AC and generating a zero crossing detection signal ZC, a memory unit 35 for storing a delay algorithm therein, and a central processing unit 33 for reading a delay algorithm from the memory unit 35, performing a delay program, delaying the same for as much as the programmed delay constant DK, and outputting a latch clock signal LCK to the latch unit 32.

Here, the detection voltage dividing unit 31 includes a resistor R31 connected between an input terminal receiving a detection input voltage VI and an input terminal D of the latch unit 32, a resistor R32 connected between another input terminal receiving the detection input voltage VI and the input terminal D of the latch unit 32, and a condenser C31 connected in parallel with the resistor R32.

As the latch unit 32, a D-type flip-flop 32-1 is used in the present invention.

In addition, the central processing unit 33 includes a delay processing unit 33-3 for receiving a zero-crossing detection signal ZC from the zero crossing detection signal generation unit 34, delaying the same for a predetermined time by the delay constant DK programmed based on the delay algorithm read from the memory unit 35, and outputting a latch clock signal LCK to the clock signal input terminal CK of the D-type flip-flop 32-1 of the latch unit 32.

The operation of the output voltage detection circuit for a traffic signal controller according to the present invention will now be explained with reference to the accompanying drawings.

First, when supplying a power to the traffic light ON/OFF cable for turning on the traffic light, the detection input voltage VI having an alternating current component, as shown in FIG. 4D, from the traffic light ON/OFF cable is divided into voltages having a predetermined level by the resistors R31 and R32 and is charged into the condenser C31. The thusly charged voltage is applied to the input terminal D of the D-type flip-flop 32-1 of the latch unit 32. Here, the level of the voltage applied to the input terminal D is a TTL level of about 5 volts.

The resistance values of the resistors R31 and R32 are computed and set such that the D-type flip-flop 32-1 recognizes the voltage value at the input terminal D as a high level value when the detection input voltage VI reaches a detection reference value, namely, a start voltage at which the presence of the voltage is recognized.

The D-type flip-flop 32-1 is a device which is capable of maintaining the level of the input terminal D from a rising edge input timing of the latch clock signal LCK to a rising edge input timing of the next latch clock signal LCK. Namely, the voltage supplied to the input terminal D is latched in synchronization with the rising edge of the latch clock signal LCK, as shown in FIG. 4C, supplied from the central processing unit 33.

Therefore, in the D-type flip-flop 32-1, the detection output voltage VO is outputted in accordance with a condition that whether a detection input voltage VI is inputted from the output terminal /Q in synchronization with the latch clock signal LCK.

As shown in FIG. 4A, an alternating current voltage i applied to the zero crossing detection signal generation unit 34, the zero crossing detection signal generation unit 34 detects a zero crossing timing and generates a zero crossing detection signal ZC as shown in FIG. 4B. When the zero crossing detection signal ZC is applied to the central processing apparatus 33, the delay processing unit 33-1 of the central processing unit 33 reads a delay algorithm from the memory unit 35, performs the delay program, generates a latch clock signal LCK, as shown in FIG. 4C, which is obtained by delaying the zero crossing detection signal ZC as much as the programmed delay constant DK, and outputs the thusly generated latch clock signal LCK to the clock signal input terminal CK of the D-type flip-flop 32-1.

In the D-type flip-flop 32-1 of the latch unit 32, a detection output voltage VO, as shown in FIG. 4E, is outputted from the output terminal in synchronization with the latch clock signal LCK.

Therefore, it is possible to adjust the latch timing of the D-type flip-flop 32-1 by using the programmed delay constant DK. Therefore, even though the detection input voltage VI is an alternating current voltage which is varied in accordance with a time lapse, it is possible to latch at the peak point of the alternating current voltage in accordance with a latching timing and to latch at a point near the peak point, so that it is possible to vary a predetermined detection reference value.

As described above, since the latch clock signal LCK delayed by using the latch device and the delay constant DK programmed by the delay algorithm is used as a clock signal for the D-type flip-flop 32-1 of the latch unit 32, it is possible to accurately adjust a detecting timing. In addition, it is possible to easily implement a voltage feeding-back circuit within an operational temperature range (generally, −34° C.~+74° C.) of a traffic signal system by minimizing the variation of a characteristic with respect to the operational temperature variation. Namely, when an input voltage is below AC 15 volts, the voltage is not detected, and when the input voltage is above AC 25 volts, the voltage is detected. Furthermore, it is possible to implement all devices as a hybrid integration device, and it is possible to manufacture a compact product.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An output voltage detection circuit for a traffic signal controller, comprising:
   a detection voltage dividing unit for dividing a detection input voltage having an alternating current component applied to a traffic signal system into voltages having a predetermined level;
   latch means for latching a voltage from the detection voltage dividing unit and generating a detection output voltage;
   zero crossing detection signal generation means for detecting a zero crossing timing from an alternating current voltage power and generating a zero crossing detection signal;
   memory means for storing a delay algorithm therein; and
   a central processing unit for supplying a latch clock signal to the latch means wherein the latch clock signal is a delayed version of the zero crossing detection signal, the delay being a function of the delay algorithm.

2. The circuit of claim 1, wherein said central processing unit includes a delay processing means wherein the delay processing means supplies the latch clock signal to the latch means wherein the latch clock signal is the delayed version of the zero crossing detection signal, the delay being a function of the delay algorithm.

3. The circuit of claim 1, wherein said latch means uses the latch clock signal from the central processing unit as a clock signal input and includes a D-type flip-flop which is synchronized by the clock signal input.

4. The circuit of claim 1, wherein said detection voltage dividing unit includes:
   a dividing unit for dividing the detection input voltage which is applied to the traffic light system; and
   a capacitor for charging a divided voltage therein.

5. The circuit of claim 4, wherein said capacitor is used for protecting the output voltage detection circuit from surges.

\* \* \* \* \*